United States Patent [19]

Salem et al.

[11] Patent Number: 5,636,130
[45] Date of Patent: Jun. 3, 1997

[54] METHOD OF DETERMINING SIGNAL PROPAGATION DELAY THROUGH CIRCUIT ELEMENTS

[75] Inventors: Raoul B. Salem, Redwood City, Calif.; Vernon R. Brethour, Owens Cross Road, Ala.; Wen-Jay Hsu, Fremont, Calif.; Raymond A. Heald, Los Altos, Calif.; Subramanian Ganesan, San Jose, Calif.

[73] Assignee: Sun Microsystems, Inc., Mountain View, Calif.

[21] Appl. No.: 498,338

[22] Filed: Jul. 5, 1995

[51] Int. Cl.⁶ .................................................. G06F 17/50
[52] U.S. Cl. ........................................................ 364/488
[58] Field of Search ...................... 395/550; 366/488–491

[56] References Cited

U.S. PATENT DOCUMENTS

| | | | |
|---|---|---|---|
| 5,210,700 | 5/1993 | Tom | 364/489 |
| 5,475,605 | 12/1995 | Lin | 364/488 |
| 5,493,508 | 2/1996 | Dangelo et al. | 364/489 |
| 5,508,937 | 4/1996 | Abato et al. | 364/488 |
| 5,544,071 | 8/1996 | Keren et al. | 364/489 |

OTHER PUBLICATIONS

Library Compiler Reference Manual, vol. 1, Version 3.0, Oct. 1992.

*Primary Examiner*—Thomas M. Heckler
*Attorney, Agent, or Firm*—Hickman Beyer & Weaver, LLP

[57] ABSTRACT

A method is provided for accurately determining the propagation delay of a gate under consideration in a static timing analyzer. This is accomplished by determining both the output load and input rise time of the gate under consideration. These values are then compared with a load versus rise time grid having previously determined values of propagation delay (points) for specified combinations of load and input rise time. These points are then used to interpolate a value of propagation delay for the gate under consideration by an interpolation technique that accounts for at least one of the following non-linear effects: the feed forward capacitance of a gate, soft switching, gate resistance, source and drain resistance, and/or other non-linear effects. The method accounts for each non-linear effect by imparting a corresponding component to propagation delay only in that range of output load and input rise time for which that non-linear effect is most pronounced.

31 Claims, 8 Drawing Sheets

METHOD OF DETERMINING SIGNAL PROPAGATION DELAY THROUGH CIRCUIT ELEMENTS

BACKGROUND OF THE INVENTION

The present invention relates to computer assisted design (CAD) tools used in designing synchronous logic, such as microprocessors. More particularly, the present invention relates to methods by which CAD tools such as timing analyzers determine the propagation delay of gates in synchronous designs.

During the development of synchronous machines, various designs are proposed and modified. Each design is tested for bugs and for performance (i.e., speed) and modified accordingly to remove bugs and improve performance. Ultimately, a design is deemed sufficiently bug-free and fast to be frozen and converted to hardware.

Each design considered in this process consists of stages which are delimited by clocked elements. The clocked elements are connected to other clocked elements by various paths consisting of at least a wire and potentially many wires and gates. The design's speed can be determined by predicting the delay between any two stages in the processor design with a tool known as a static timing analyzer. Typically, in current microprocessor designs, the delay between stages is on the order of nanoseconds.

FIG. 1 shows a hypothetical representative section 2 of a microprocessor design in a synchronous computer. Section 2 may be a part of a device layout proposed during the development of a microprocessor design. The microprocessor has clocked elements 4, 6, and 8 among many others not shown. Most typically, a clocked element is a flip-flop, latch, a register or memory. Between clocked elements 6 and 8, there are a series of gates 30, 32, 36, and 38 and branches 10 and 14 which connect with other clocked elements (not shown) in the system.

By determining the slowest path between each two successive clocked elements, the speed of the processor design can be determined. Static timing analyzers do this by a data invariant determination of the slowest path between each two successive clocked elements. For example, in the section shown in FIG. 1, a static timing analyzer will begin at clocked element 6, determine the delay between that element and the first gate it encounters, gate 30, and then determine the delay between gate 30 and the next gate on its path, gate 32. At this point, a branch 10 is reached, and the static timing analyzer must determine which path to take. In order to give a conservative estimate of speed, the timing analyzer always takes the path that will require most time to traverse. Determining which branch meets this requirement may be accomplished by any of several algorithms used in the commercial tools. The simplest one (more efficiency is possible) is a two pass computation which determines the delay to every node and then sorts for the longest delays to the clocked elements. In this manner, the timing analyzer can determine which path between any two timing elements is slowest, and how much time it takes to traverse that path. By combining these times, the overall speed of the processor design is determined.

The amount of time required to traverse any path on a typical microprocessor is often governed by the propagation delay of each gate on that path. The propagation delay (sometimes referred to as propagation time) is the amount of time required by a gate to switch states in response to a signal change on its input pin. A very accurate value of the propagation delay can be obtained by modeling the transistors included in the gate and numerically solving the differential equations describing these transistors. Various numerical routines such as SPICE (available from the University of California, Berkeley) are available for making such accurate determinations. While the accuracy of these products is unquestioned, they are computationally expensive and therefore unsuitable for use in a static timing analyzer which must typically determine the propagation delay of at least one hundred thousand different gates.

Thus, prior static timing analyzers have approximated the propagation delay by computationally simple techniques as illustrated in FIG. 2. The actual propagation delay of a gate is a function of the load on that gate (among other variables) as shown by the curve labeled "Actual" in FIG. 2. Early static timing analyzers approximated actual propagation delay as a linear function of the load on a gate, as shown in the line labeled "Linear Model" in FIG. 2. Unfortunately, this approximation is quite inaccurate for large fractions of the curve, especially in smaller devices. This led some in the field to approximate propagation delay as a series of lines connected by "breakpoints" as shown as the multi-part curve labeled "Breakpoint Model" in FIG. 2. While representing an improvement, the Breakpoint Model was found to be insufficient for many applications. This led some researchers to look for a continuous mathematical expression that would describe the "actual" relationship between gate load and propagation delay, and efforts in this area continue today. Ultimately, however, some in the field concluded that even this approach was never going to prove sufficiently accurate because the propagation delay of a gate is actually a function of both input "rise time" and load. The input rise time of a gate is the time required (typically on the order of a few hundred picoseconds up to nanoseconds) for an input voltage signal to that gate to switch from low to high or high to low, whichever direction is appropriate. This is a function of the output switching time of a gate immediately preceding the gate under consideration in a path within the network and, potentially, the wire between these gates. Because propagation delay is a function of both input rise time and load, it can be represented as a three dimensional surface (such as that shown in FIG. 6 and discussed below) having a projection on a plane defined by a load "axis" and an input rise time "axis."

One static timing tool, which is incorporated in the product "Design Compiler"® available from Synopsys, Inc., Mountain View, Calif., does in fact treat propagation delay as a surface which is a function of input rise time and gate load. Design Compiler® provides a lookup table having grid points defined by combinations of load and input rise time. For each such grid point, a propagation time is provided which was previously determined by a numerical analysis of the transistors making up a gate, and using the input rise time and load as specified by the grid point. When Design Compiler® is presented with a gate, it first determines the input rise time and load associated with that gate. It then finds a "subsurface" within which the gate's load and input rise time resides. This subsurface is defined by four grid points having adjacent values of load and input rise time. Design Compiler® then calculates a propagation delay of the gate under consideration by interpolating within the four grid points defining the appropriate subsurface. Design Compiler® uses the following widely-used "textbook" formula:

propagation delay=$A+B$(rise time)+$C$(gate load)+$D$(rise time)*(gate load)

where A, B, C, and D are coefficients determined from the coordinates of the four points defining the appropriate subsurface. The first three terms are linear and the fourth is non-linear. The coefficients are determined by writing an equation in this form for each of the four grid points which define the subsurface. For each equation, the propagation delay, input rise time, and gate load are known, and the coefficients A, B, C, and D are the variables. The resulting system of four linear simultaneous equations is solved for A, B, C, and D. With the values of A, B, C, and D known, the original formula may now be used to find the propagation delay for the actual input rise time and gate load.

Unfortunately, it has been found that the approach used by Design Compiler® provides somewhat inaccurate results, particularly in the regions where input rise time is relatively large (i.e., slow switching) and gate load is relatively small. Thus, for static timing analyzers there exists a need for a more accurate method of predicting the propagation delay of a gate.

SUMMARY OF THE INVENTION

The present invention provides a method for accurately determining the propagation delay of a gate under consideration in a static timing analyzer implemented on computer with a memory. The invention accomplishes this by considering both the load and input rise time of the gate under evaluation. These values are then compared with a load versus input rise time grid having previously determined values of propagation delay (points) for specified combinations of gate load and input rise time. These points are then used to interpolate a value of propagation delay for the gate under consideration by an interpolation technique that accounts for one or more specified non-linear effects on the propagation delay of a gate. As used herein, a "non-linear effect" is one that influences the choice of a non-linear term in an interpolation technique employed to approximate the value of propagation delay. Among the non-linear effects that can be considered are feedforward capacitance, a slow input rise time, and a non-zero resistance of the gate or source/drain.

As far as is known, no prior static timing analyzer takes any of the above effects into account, and therefore known static timing analyzers are somewhat inaccurate, particularly as applied to submicron devices, where the various non-linear effects are more pronounced. Preferably, the system accounts for a slow input rise time by imparting a contribution (during interpolation) which decreases the value of propagation delay in the direction of increasing input rise time and decreasing gate load—especially in the region where input rise time is relatively large and load is relatively small. If feedforward capacitance is the predominant non-linear effect, the system imparts a contribution during interpolation that increases the propagation delay in the region of short input rise times and small gate loads. It is helpful to understand that feedforward capacitance is an effect manifested in devices whereby a short input rise time (i.e., fast switching) causes a charge to be transferred from the input to the output of a gate which must then be dissipated by that gate. Thus, the gate exhibits a propagation delay that is somewhat larger than it would have been otherwise. It should also be understood, that the non-linear term employed by Design Compiler® (i.e., D(rise time)*(gate load)) primarily affects values of propagation where gate load and input rise time are both relatively large. The interpolation methods of this invention provides more accurate results by employing non-linear terms that primarily affect other regions of the propagation delay surface.

One aspect of this invention provides a method of determining propagation delay of a selected gate in a synchronous design according to the following sequence of steps: (a) receiving a grid of points each specifying a propagation delay for a unique combination of gate load and input rise time; (b) determining the load associated with the selected gate; (c) determining the input rise time for the selected gate; (d) from the grid of points, identifying at least three points which have combinations of gate load and input rise time such that these points surround the point defined by the combination of gate load and input rise time for the selected gate; and (e) interpolating within the points identified in step (d) to determine the propagation delay of the selected gate, the interpolating being conducted by a technique that accounts for a non-linear gate effect such as feedforward capacitance, slow input rise time, and non-zero gate or source/drain resistance.

In preferred embodiments, four points are identified from the collection of points, and the step of interpolating employs one of the following expressions to specify the propagation delay of the gate under consideration:

propagation delay=$A+B$(rise time)+$C$(gate load)+$D$(rise time)(gate load)    1.

propagation delay=$A+B$(rise time)+$C$(gate load)+$D$(gate load)/(rise time)    2.

propagation delay=$A+B$(rise time)+$C$(gate load)+$D$(rise time)/(gate load)    3.

propagation delay=$A+B$(rise time)+$C$(gate load)+$D$/(rise time)(gate load)    4.

where A, B, C, and D are coefficients determined from the coordinates of the four points identified from the collection of points. Expression 1 was used alone in the prior Design Compiler® product. The last terms in the other expressions (e.g., D(rise time)/(gate load)) should be contrasted with the product corresponding term of expression 1 (D(rise time)* (gate load)). By providing alternatives to the product term of prior art, it is possible to find an expression which more accurately accounts for the non-linear effects of feedforward capacitance, slow input rise time, and non-zero gate or source-drain resistance.

The propagation delay determined according to the method of this invention is used by static timing analyzers to determine the speeds of a synchronous designs. To do this, a static timing analyzer performs the following steps: (a) identifying the slowest path between two clocked elements in the design (which typically includes a plurality of gates); and (b) determining a total delay required to traverse the slowest path. Preferably, the step of determining the total delay includes the following steps: (i) determining a connection delay between each two gates on the slowest path; and (ii) summing the connection delays and propagation delays of the gates on the slowest path to obtain the total delay. After the total delay is determined, it may be used to modify the synchronous design to obtain a final synchronous design—in accordance with standard design criteria. This final design can then be incorporated in hardware such as a microprocessor.

Another aspect of this invention provides a static timing analyzer which includes the following elements: (a) a load analyzer which determines the load of each gate on a path; (b) an input rise time analyzer which determines the input rise time of each gate on the path; (c) a grid including a plurality of grid points each having a predetermined value of propagation delay for a unique combination of gate load and input rise time; and (d) an interpolator which determines the propagation delay of each gate on the path by interpolating within at least four grid points defining a surface of propagation delay values, the surface being shaped such that it accounts for a non-linear gate effect such as feedforward capacitance or slow input rise time. Generally, the static timing analyzer will take the form of a programmed digital computer having a memory in which values of the grid points are stored. Preferably, the static timing analyzer also includes a means for determining the total delay on the slowest path between any two clocked elements by summing the propagation delays of the gates on the slowest path and connection delays between each two gates on the slowest path.

These and other features of the present invention will be presented in more detail in the following specification of the invention and the figures.

DESCRIPTION OF THE PREFERRED EMBODIMENTS

1. Physical Embodiment

The invention employs various process steps involving data stored in computer systems. These steps are those requiring physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, values, elements, variables, or the like. It should be remembered, however, that all of these and similar terms are to be associated with the appropriate physical quantities and are merely convenient labels applied to these quantities.

Further, the manipulations performed are often referred to in terms, such as identifying, evaluating, or interpolating. In any of the operations described herein that form part of the present invention, these operations are machine operations. Useful machines for performing the operations of the present invention include general purpose digital computers or other similar devices. In all cases, there should be borne in mind the distinction between the method of operations in operating a computer and the method of computation itself. The present invention relates to method steps for operating a computer in processing electrical or other physical signals to generate other desired physical signals.

The present invention also relates to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or a more specialized apparatus may be used to perform the required method steps. The required structure for a variety of these machines will appear from the description given below.

Figure 3:
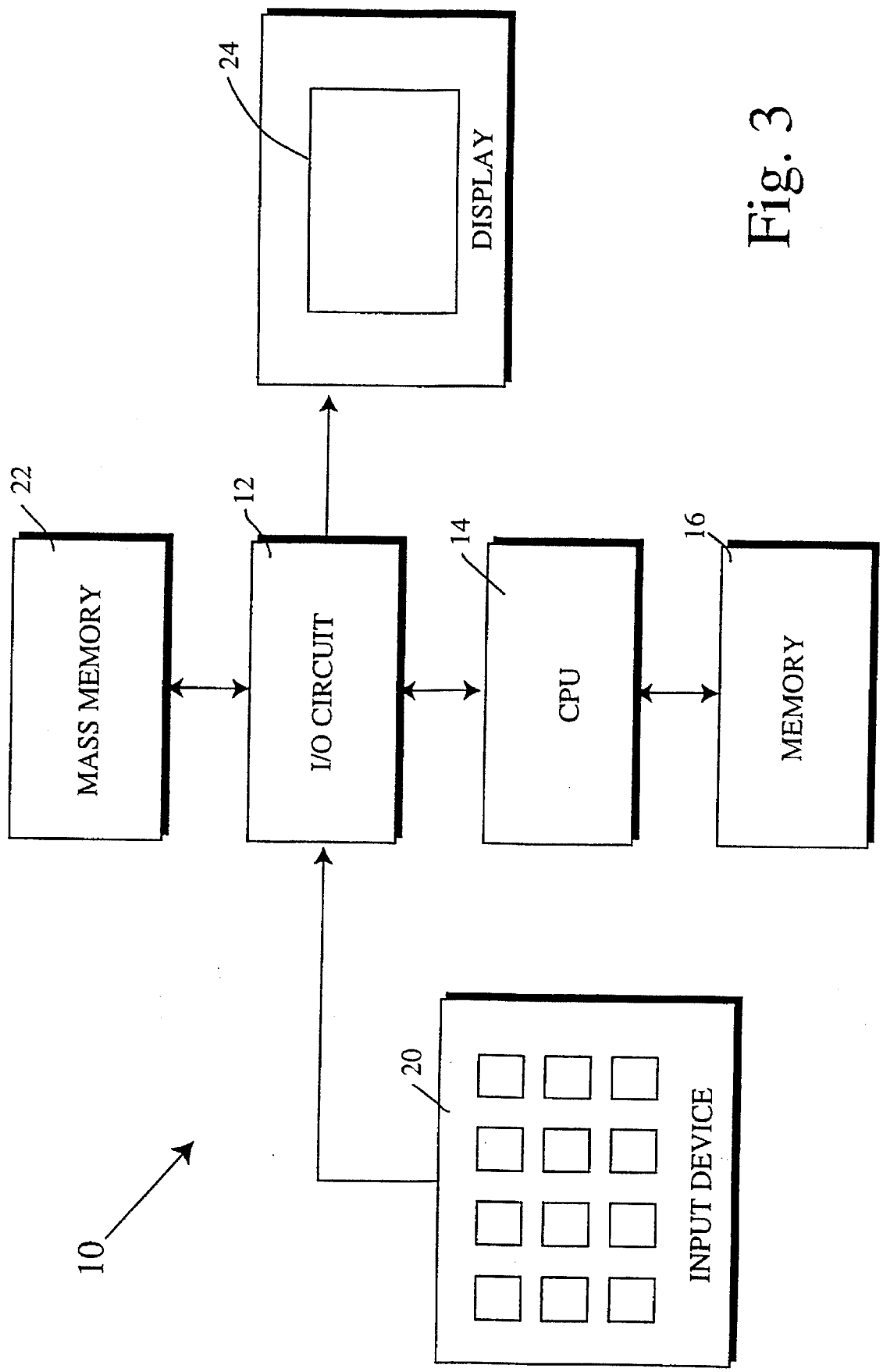
FIG. 3 is a block diagram of a generic system suitable for running static timing analyzers provided in accordance with this invention.

FIG. 3 shows a typical computer-based system according to the present invention. Shown is a computer 10 which comprises an input/output circuit 12 used to communicate information in appropriately structured form to and from the parts of computer 10 and associated equipment, a central processing unit 14, and a memory 16. These components are those typically found in most general and special purpose computers 10 and are intended to be representative of this broad category of data processors.

FIG. 3 also illustrates an input device 20 shown as a keyboard. It should be understood, however, that the input device 20 may actually be a transducer card reader, a magnetic or paper tape reader, a tablet and stylus, a voice or handwriting recognizer, or some other well-known input device such as, of course, another computer. A mass memory device 22 is coupled to the input/output circuit 12 and provides additional storage capability for the computer 10. The mass memory device 22 may be used to store programs, data and the like and may take the form of a magnetic disk or some other well known device. It will be appreciated that the information retained within the mass memory device 22, may, in appropriate cases, be incorporated in standard fashion into computer 10 as part of the memory 16.

In additional, a display monitor 24 is illustrated which is used to display the images being generated by the present invention. Such a display monitor 24 may take the form of any of several well-known varieties of cathode ray tube displays or some other well known type of display.

As is well-known, the memory 16 may store programs which represent a variety of sequences of instructions for execution by the central processing unit 14. For example, instructions for approximating propagation delay in a static timing analyzer may be stored within the memory 16. In addition, the memory 16 may store grid points employed by a static timing analyzer in its interpolation function.

2. Method for Approximating Propagation Delay

Figure 1:
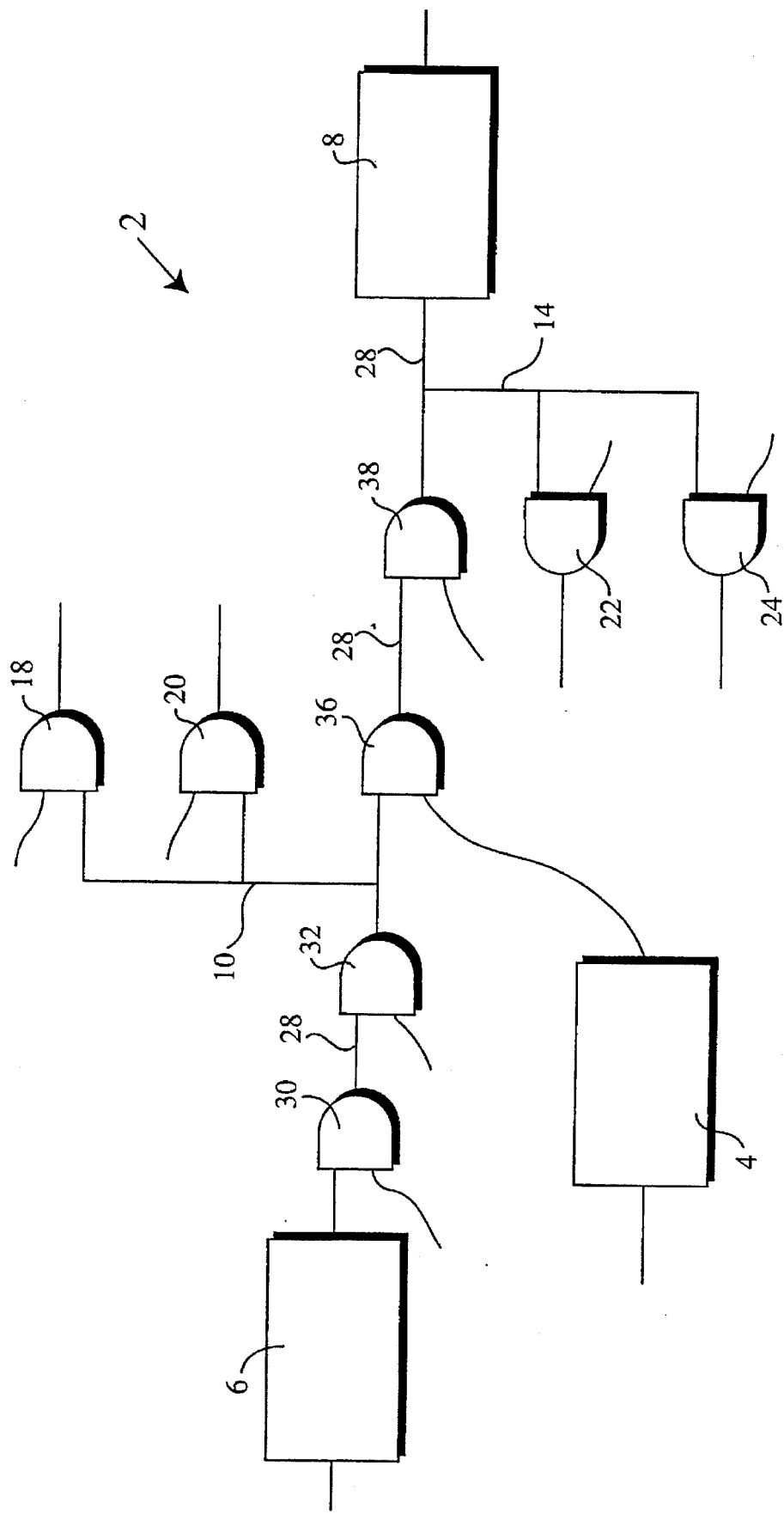
FIG. 1 is schematic diagram of a synchronous design section including clocked elements and gates.
Figure 2:
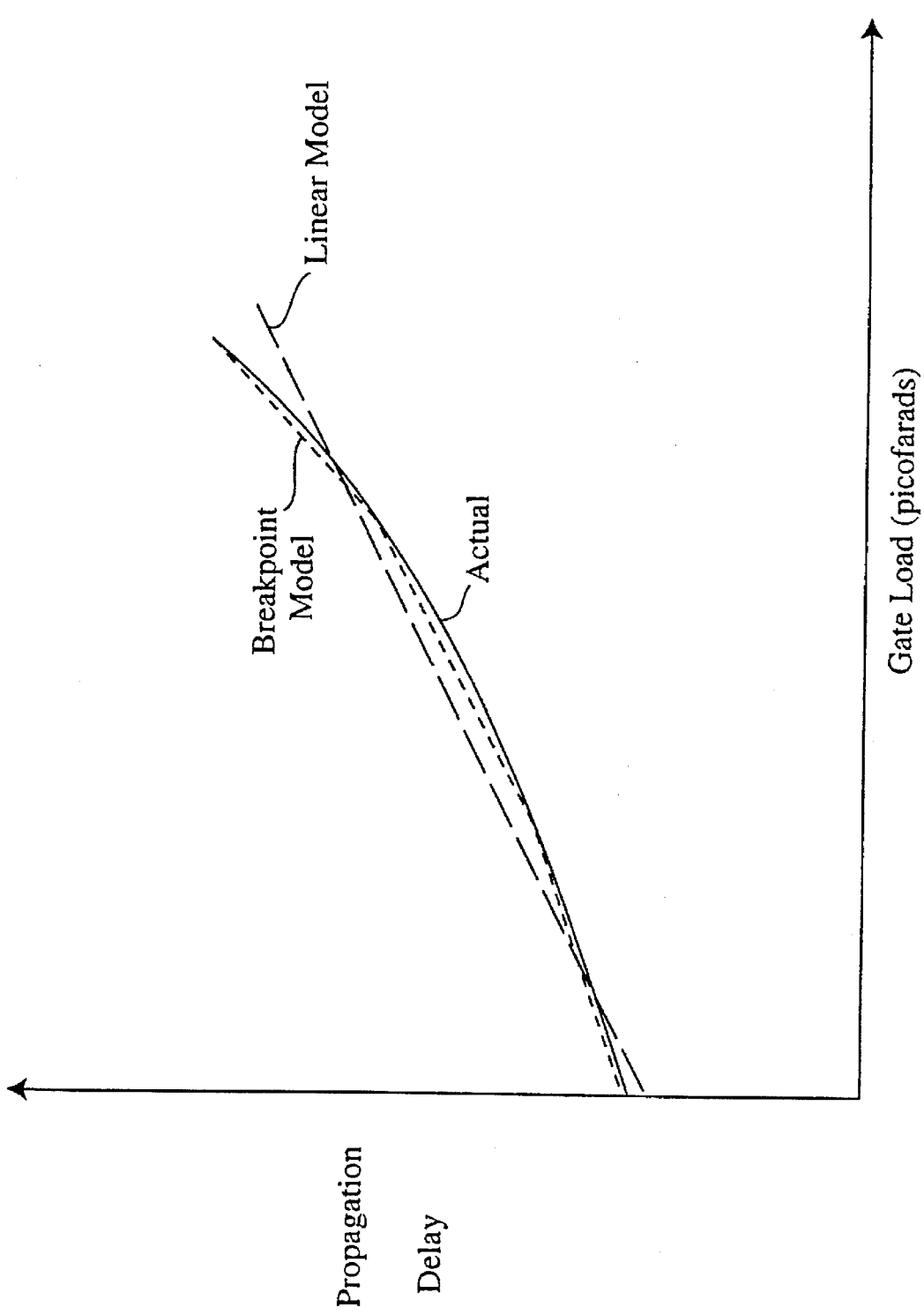
FIG. 2 is a graph of a hypothetical curve of gate propagation delay as a function of gate load.

Like prior static timing analyzers, the static timing analyzers of this invention (1) determine the slowest path between two clocked elements in a synchronous design, and (2) determine the time required to traverse this slowest path. This may be understood with reference to FIG. 1 which, as noted above, shows a typical design section including clocked elements 6 and 8, and, in addition, clocked element 4. The clocked elements are connected to one another by various paths which include gates and branch points. For example, clocked elements 6 and 8 are connected by a path 28 including gates 30, 32, 36, and 38, each of which has at least one input (illustrated as unconnected input lines for the gates) from a source external to the path 28. It should be noted that path 28 includes two branch points: one leading to a branch 10 between gates 32 and 36, and a second leading to branch 14 between gate 38 and clocked element 8. Branch 10 itself has two branches, one leading to a gate 18 and the other leading to a gate 20. Likewise, branch 14 includes two branches, one leading to a gate 22 and the other leading to a gate 24. Each of these branches may, in turn, lead to clocked element 8 by a path independent of path 28. It is of course possible that one or more of such paths may be slower than path 28, in which case the slowest of these alternative paths would be used to determine the processor performance. Regardless of which path is identified as slowest, the propagation delays of all gates on that path must be accurately determined in order to determine the speed of the design.

The propagation time or delay of gate is an inherent property of that gate. It represents the time required by a gate to generate an output signal in response to an input signal. Gates are, of course, arrangements of transistors used in logic circuits. In a given design, the propagation time varies from gate to gate depending upon the location of each gate with respect to other gates in a design, and the inherent properties of each transistor (e.g. channel resistance, threshold voltage, etc.) in the gate. By thoroughly analyzing a gate's inherent properties in the context of its arrangement in a processor, a numerical tool such as SPICE can accurately obtain a propagation time associated with the gate. A static timing analyzer must make a much more superficial analysis of the propagation delay for a given gate because it generally has to evaluate at least one hundred thousand such gates. The static timing analyzers of this invention obtain a reasonable estimate of the propagation delay of any gate under consideration from that gate's load and input rise time. This is accomplished by interpolating on a surface defining propagation delay (as a function of load and input rise time) and including one or more non-linear effects such as a slow input rise time or a feedforward capacitance, as explained below.

The load associated with any gate results from the capacitances of each gate downstream from the gate under consideration as well as the capacitances of the lines connecting these downstream gates. As the load on a gate increases, that gate's output pin requires more time to charge and therefore the gate's propagation delay increases. In the example shown in FIG. 1, the load on gate 32 includes the sum of the capacitances of gates 18, 20, and 36. In addition, the load on gate 32 includes the total capacitance of the lines connecting these gates.

The input rise time of a gate (which is proportional to the reciprocal of the gate's "slew rate") is a function of the previous gate's output rise time and any RC effects of the connecting wire between these gates. The output rise time of the previous gate is, in turn, a function of that gate's input rise time, output load, any RC effects of the connecting wire between these gates, and internal properties (i.e., the same variables used to determine the gate's propagation delay). In practice, much of the framework used to determine a gate's propagation delay can also be used to determine that gate's output rise time.

Figure 4:
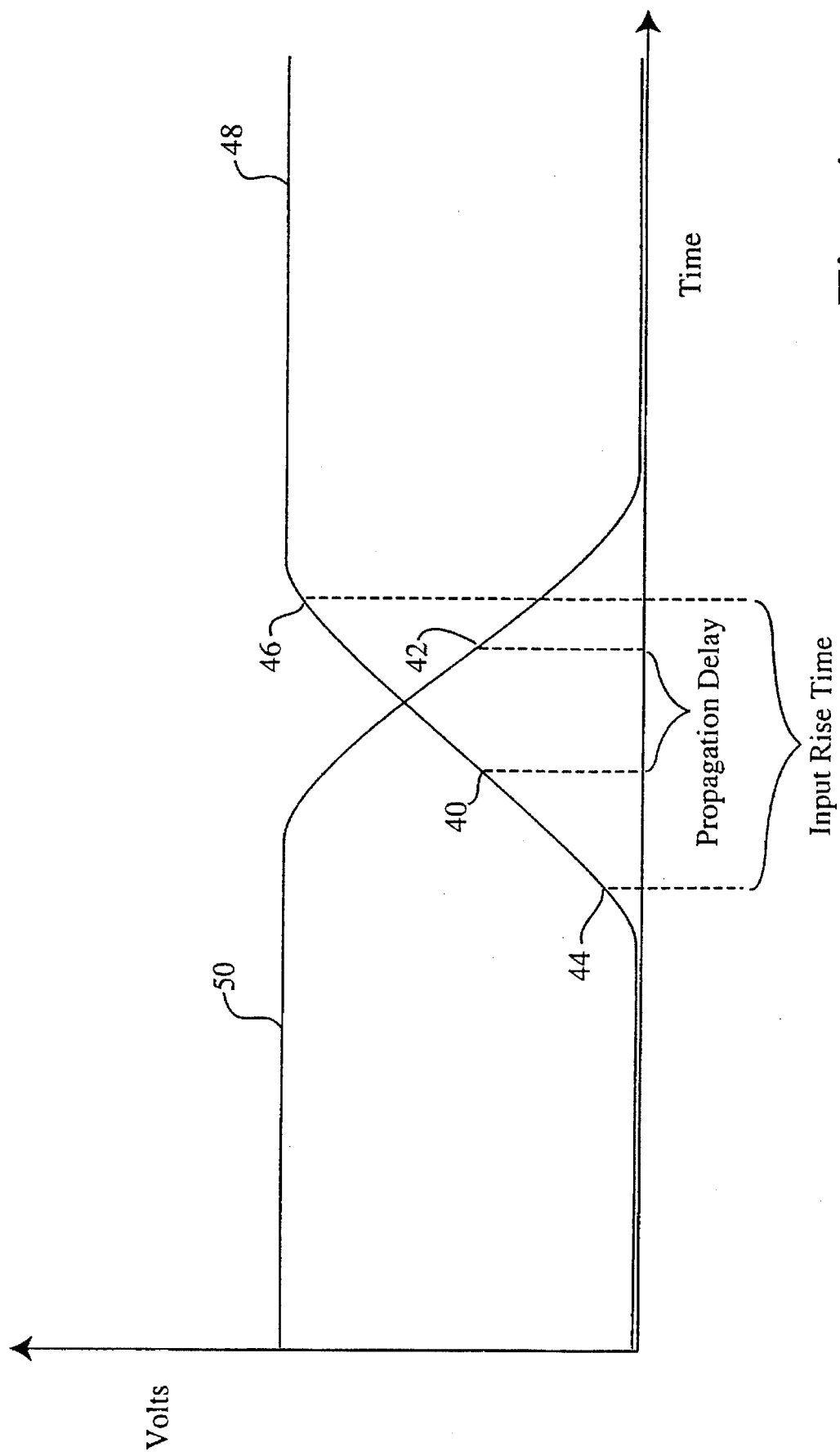
FIG. 4 is a diagram of input and output signals showing the input rise time and propagation delay of a typical gate.

The input rise time and propagation delay of a gate are illustrated in terms of a gate's input and output signals in FIG. 4. A signal 48 represents the voltage signal received at an input pin of a gate. The upward sloping section of the input signal (between points 44 and 46) determines the input rise time of the gate under consideration. Generically, the input rise time is the time required for an input signal to move from a low state to a high state or vice versa (shown as the region of the "Time" axis labeled "Input Rise Time"). This is, in fact, the input rise time used by static timing analyzers of the present invention to determine propagation delay. Often, however, it is convenient to define the input rise time as some fraction of the time required to completely switch between states, e.g., the time required to move from 20% to 80% of the transition between states.

The output signal 50 represents the signal provided at the output pin of the gate. It should be understood that the output signal 50 shown in FIG. 4 for the gate under consideration closely approximates the input rise time for the next gate in a processor path. At some point after the input signal 48 begins switching from low to high (or vice versa), the output signal 50 begins switching from high to low (or vice versa if appropriate). The propagation time of a gate is defined as the time difference between the points when the input and output signals switch. Most conveniently, the propagation time is calculated as the delay between the points when the input signal has undergone 50% of its transition from low to high and when the output signal has undergone 50% of its transition from high to low. Stated another way, the propagation delay of a gate may be defined as the time difference between the point of 50% change in the rising portion of the signal on the input pin and the point of 50% change in the falling portion of the signal on the output pin. This is illustrated on the "Time" axis of FIG. 4 in the region labeled "Propagation Delay."

For gates having relatively long input rise times, this method of calculating propagation delay may introduce a non-linear effect due to the "early" switching of the gate before the 50% point on the input pin is reached. Because the gate begins to switch well before the 50% point is reached on the input signal (as shown by comparison of signals 48 and 50 in FIG. 4), the value of propagation delay is actually lower than would be predicted for immediate switching at the 50% point. As will be explained in more detail below, the methods of this invention account for large input rise times, by employing interpolation techniques that impart a component that decreases the calculated value of propagation delay in the region of long rise times and small gate loads (where the non-linear effect is most pronounced). What constitutes a long input rise time and a small gate load will, of course, vary depending on the fabrication process employed to create the circuitry under consideration. In one embodiment, an input rise time on the order of nanoseconds is considered slow.

Figure 5:
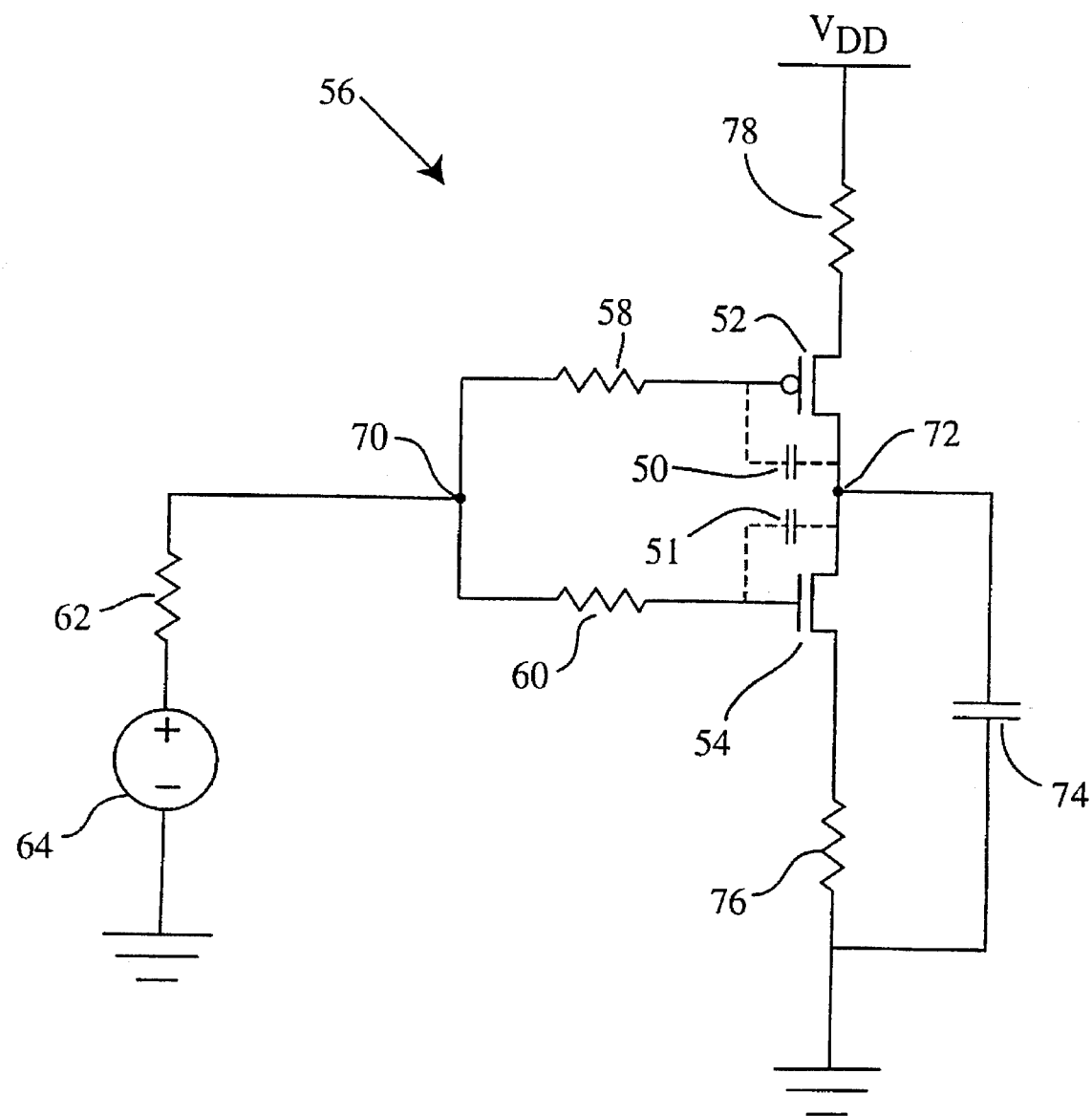
FIG. 5 is a schematic diagram illustrating various sources of non-linear propagation delay effects in an inverter.

FIG. 5 illustrates sources of various other non-linear effects on propagation delay in a CMOS inverter. The inverter 56 includes p-channel MOS transistor 52, and n-channel MOS transistor 54, and input and output nodes 70 and 72. The inverter input 70 responds to signals from signal generator 64 (which has an associated resistance 62) and drives a load represented by load capacitance 74. P-channel transistor 52 is shown including a pseudo-capacitor 50 (representing a feedforward capacitance) and the n-channel transistor 54 is shown with a corresponding pseudo-capacitor 51 (which also represents a feedforward capacitance). Both of these sources of feedforward capacitance have the effect of slowing the gate output. This effect is largest when the gate's input rise time is very short and the gate's load is relatively low. Under these conditions, charge is transferred from the input node to the output node which must then be dissipated, thus adding a delay to switching of the inverter 56. For purposes of this invention, it is important to recognize that this effect causes the propagation delay to have a higher value (than it would in the absence of feedforward capacitance) in the domain where input rise time is relatively short and gate load is relatively low. For large gate loads, the gate performance is less affected by feedforward capacitance.

Another source of non-linear behavior is the inherent resistance of certain MOS device elements such as gates, sources, and drains. As shown in FIG. 5, the transistor gates have non-zero resistances indicated by resistor 58 for the p-channel device and resistor 60 for the n-channel device. These gate resistances have the effect of increasing the value of propagation delay for short input rise times and small loads. Thus, the effects of feedforward capacitance and gate resistance (which increase rather than decrease propagation delay) are opposite that caused by long input rise times (soft switching) discussed above. Depending upon the gate design, these effects may partially offset one another.

The sources and drains also have non-zero resistances which are indicated by resistor 78 for a source on p-channel transistor 52 and by resistor 76 for a source on n-channel transistor 54. The drains also have corresponding resistances (not shown). As the resistances of the sources and drains become more pronounced, the value of the propagation delay generally increases for all values of input rise time and gate load. In addition, large source and drain resistances may generally increase propagation delay for gates having large loads and short input rise times.

It should be understood that still other sources of non-linear gate response may exist for any given gate. When such effects are identified, they may be accounted for with an appropriate non-linear interpolation term as explained below. In general, non-linear contributions become more pronounced as device sizes decrease from 0.35 μm to 0.1 μm and beyond.

Figure 6:
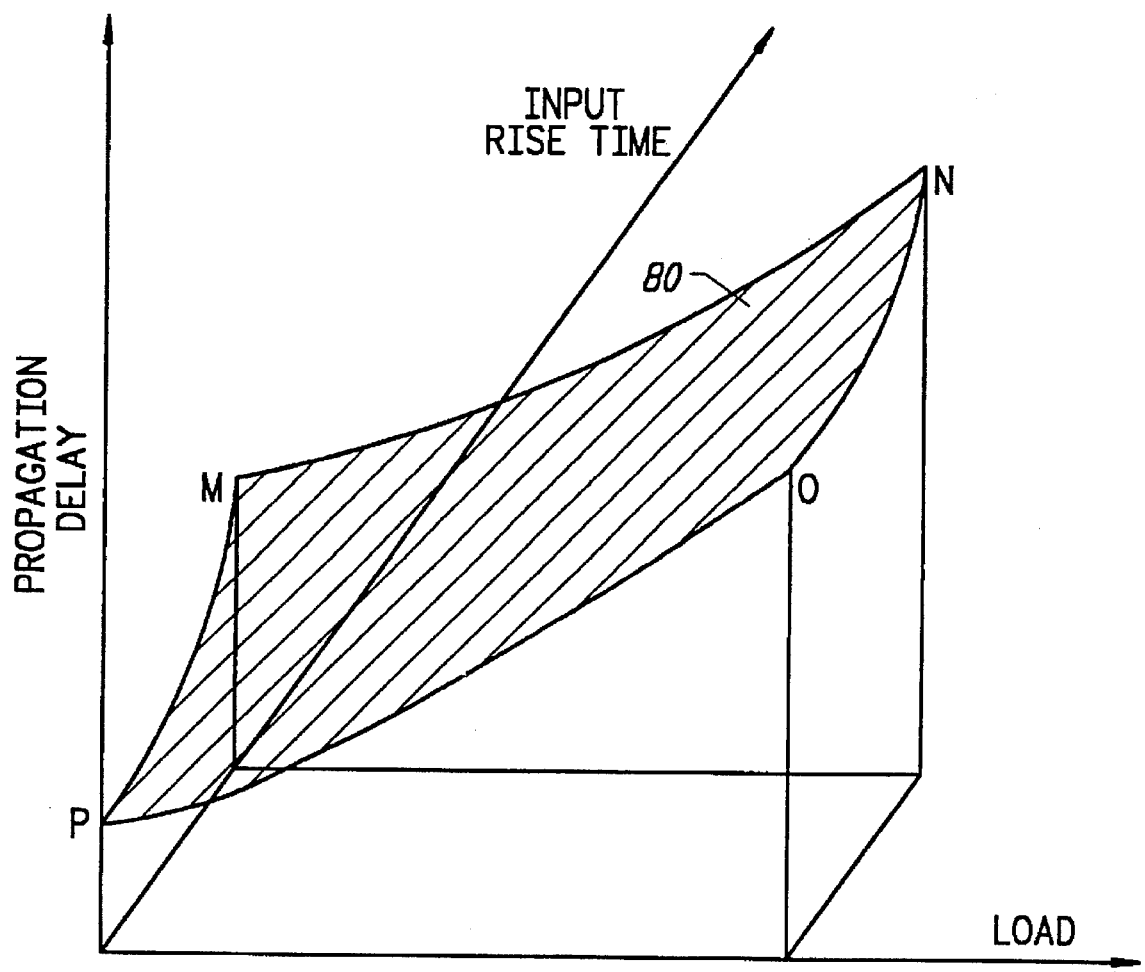
FIG. 6 is a three dimensional graph of a surface representing gate propagation delay as a function of input rise time and load.

The effects of the above non-linear effects on propagation delay are illustrated graphically in FIG. 6 where the actual propagation delay of a gate is illustrated as a surface 80 projected on a load versus input rise time plane. This figure is intended to represent the actual variation in propagation delay as exists in real semiconductor inverters. For purposes of illustration, the surface 80 is bounded by four points: M, N, O, and P. As predicted by conventional two-dimensional models, the propagation delay value increases non-linearly with increasing gate load. In addition, the propagation delay decreases with decreasing input rise time, and further, the slope of propagation delay varies locally due to one or more non-linear gate effects such as those discussed above.

In accordance with this invention, the various effects mentioned above can be accounted for by generally increasing or decreasing the value of propagation delay near a corner of surface 80 (through an appropriately chosen interpolation technique). For example, the effect of a long input rise time will generally cause the level of the surface 80 to be slightly lower in the vicinity of point P (long input rise time and small gate load). The effect of a large gate resistance will have just the opposite effect: increasing the level of the surface 80 in the vicinity of point P. A pronounced feedforward capacitance will generally increase the level of surface 80 in the vicinity of point M (small input rise time and small gate load). Further, a large source/drain resistance will generally increase the level of surface 80 in the vicinity of point N (large gate load and small input rise time).

Figure 7:
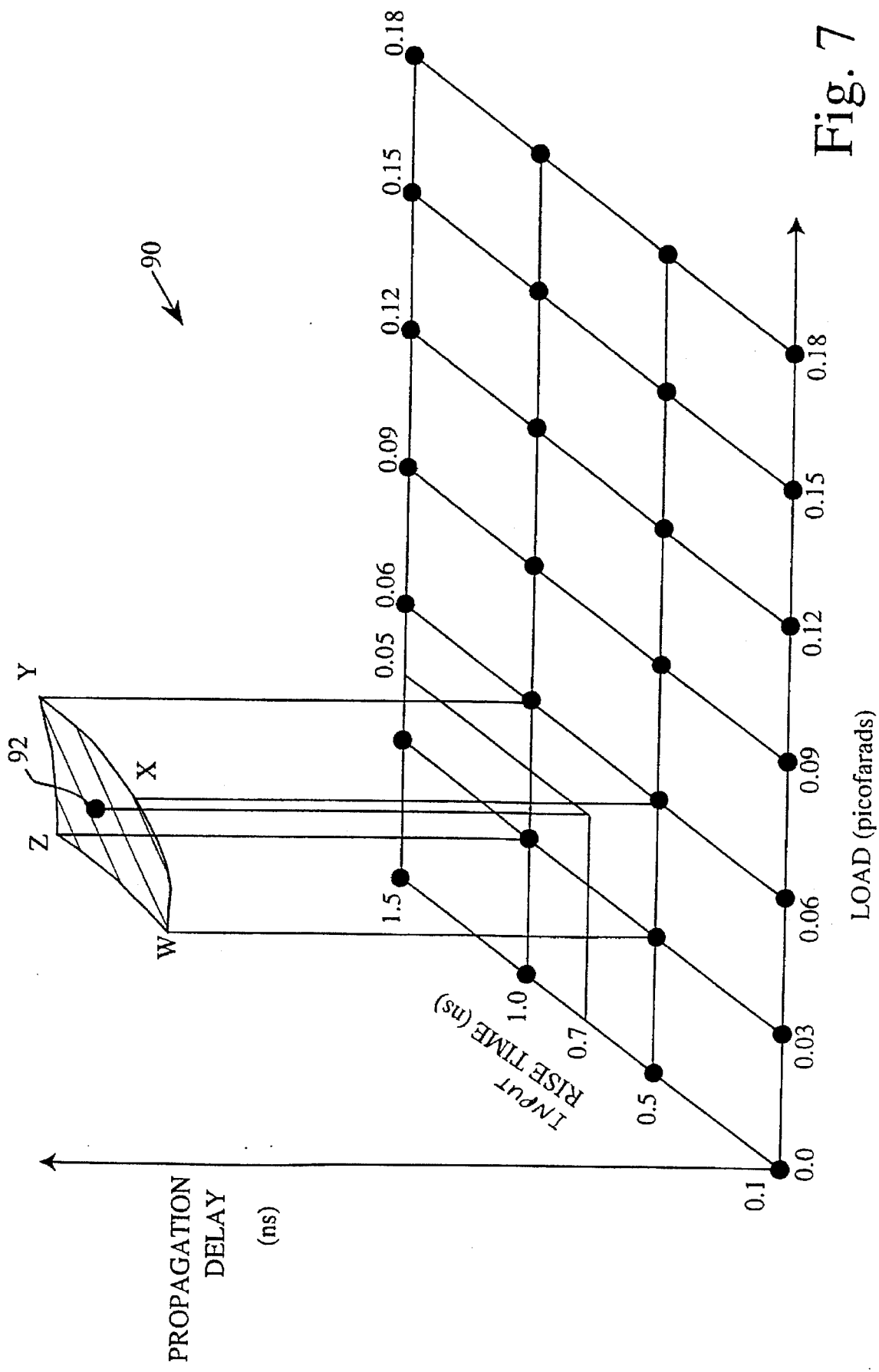
FIG. 7 is a three dimensional representation depicting how interpolation is conducted in accordance with this invention on a gate propagation delay subsurface.

In a preferred embodiment of the present invention, a grid 90 is provided as shown in FIG. 7 on a plane of gate load versus input rise time. Each point on the grid provides a value of propagation delay associated with the unique combination of input rise time and load. As shown in the example of FIG. 7, the grid points are provided in increments of 0.5 nanosecond along a rise time axis, and in increments of 0.03 picofarads along a load axis. The values of the propagation delay provided in the grid should accurately reflect the values of the actual propagation delay as experienced in nature. These values can be obtained by various techniques including testing of actual gates having known loads and input rise times, and predicting gate performance with detailed numerical models using a computer program such as SPICE. Preferably, the grid points are stored in a computer memory as part of a look-up table.

Each group of four adjacent points on the grid defines a subsurface such as that defined by points W, X, Y, and Z in FIG. 7. The entire grid, of course, includes many such subsurfaces, each of which is bounded by four grid points. In alternative embodiments, the subsurfaces may be defined by three, five, or some number other than four points. However, at least three points will always be necessary to define a subsurface. Further, if three points are employed, a relatively complicated expression for propagation delay will have to be employed.

Generally, as more grid points are provided, the accuracy of the propagation delay surface improves so that the results of the static timing analyzer become more trustworthy. At some level of detail, it becomes inefficient to add more grid points because of the additional resources required to determine and store so many grid points. Thus, the point defined by the input rise time and load of a gate under consideration typically will not be identical to any point on the grid, and some method of interpolating within grid points will be required.

According to a preferred embodiment, when a static timing analyzer is provided with values of load and input rise time for a gate, the static timing analyzer first identifies an appropriate subsurface within which those values fall. More particularly, it identifies the four points bounding the subsurface. If the gate under consideration has an input rise time and a load that exactly correspond to that of a grid point, then the true propagation time is simply picked off that grid point. More often, however, the gate's values fall within a subsurface and an interpolation technique must be employed to approximate its propagation delay on the subsurface.

According to this invention, the interpolation technique includes a contribution that accounts for a non-linear effect as described above. It has been found that, for many systems, the overriding non-linear effect causes the value of propagation time to decrease relatively slower (than it would in the absence of a non-linear effect) in the vicinity of the surface corner corresponding to the largest values of input rise time and the lowest values of load. In especially preferred embodiments, the interpolation is conducted according to one of the following four expressions:

propagation delay=$A+B$(rise time)+$C$(gate load)+$D$(rise time)(gate load)     1.

propagation delay=$A+B$(rise time)+$C$(gate load)+$D$(gate load)/(rise time)     2.

propagation delay=$A+B$(rise time)+$C$(gate load)+$D$(rise time)/(gate load)     3.

propagation delay=$A+B$(rise time)+$C$(gate load)+$D$/(rise time)(gate load)     4.

where A, B, C, and D are coefficients determined from the coordinates of the four points of known propagation delay which define a subsurface. Basically, the first three terms of each of the above expressions define a flat linear surface. The fourth term, however, imparts a non-linear component to the surface. It is this fourth term that is adjusted based upon the predominant non-linear gate effect. As written in the third expression above, the fourth term has the biggest effect in corner P (large input rise time and small gate load) of FIG. 6. As explained, this region of the surface will need to be adjusted when non-linear effects from a long input rise time (due to, e.g., soft switching) and/or a large gate resistance predominate. If, on the other hand, some other non-linear effect predominates, the fourth term may be one of the other three possibilities. For example, if the feedforward capacitance is the most important non-linear effect, then the fourth term may be D/((rise time)*(gate load)). This term is relatively large for small input rise times and small gate loads. Thus, this term has the greatest effect in the vicinity of point M in FIG. 6. In addition, if the source/drain resistances have a dominant effect, the fourth term may be D,(gate load)/(rise time). This term is relatively large for large gate loads and a small input rise times. It should also be noted that gate resistance may contribute to the value of propagation delay for long input rise times and small loads (same as is the case for long input rise times).

Although it may sometimes be possible to identify which fourth term should be used by studying the device structure, it will more often be necessary to empirically determine which expression best fits the available data. This may require trial and error with different expressions for propagation delay, each time checking the predicted values against values for actual hardware or a detailed hardware simulator such as SPICE. In general, the expression for propagation delay should remain simple, with only first order terms and only a single non-linear term (i.e., the fourth term in the above expressions). While, more complicated expressions may be employed, such expressions will tend to diminish a static timing analyzer's efficiency.

An example of a gate for which the non-linear effect of a slow input rise time predominates will now be illustrated with reference to FIG. 7 where the gate under consideration has an input rise time of 0.7 nanoseconds and a load of 0.05 picofarads. The nearest grid points on the load axis are provided at 0.03 and 0.06 picofarads, while the nearest grid points on the input rise time axis are 0.5 and 1.0 nanoseconds. Thus, the value of propagation delay for gate under consideration lies on the subsurface defined by points W, X, Y, and Z. For purposes of this example, assume that the values of propagation delay at the corners of this subsurface are given by W=0.30 nanoseconds, X=0.36 nanoseconds, Y=0.40 nanoseconds, and Z=0.32 nanoseconds. Because the predominant non-linear effect is known to be soft switching (in this example), the following expression is chosen: propagation delay=A+B(rise time)+C(gate load)+D(rise time)/(gate load).

The values of the coefficients A, B, C, and D used in the above interpolation expression can be obtained from these four points. For example, when rewritten for the points in this example, the expression becomes:

$$0.30 = A + B*(0.5) + C*(0.03) + D*(0.5/0.03)$$

$$0.36 = A + B*(0.5) + C*(0.06) + D*(0.5/0.06)$$

$$0.40 = A + B*(1.0) + C*(0.06) + D*(1.0/0.06)$$

$$0.32 = A + B*(1.0) + C*(0.03) + D*(1.0/0.03)$$

From these equations, it can be determined that the values of the coefficients are as follows: A=0.24 ns; B=0.12; C=1.33 ns/picofarad; and D=$-2.4 \times 10^{-3}$ picofarads. Thus, for the gate under consideration, the value of propagation delay (point 92) is determined as follows:

propagation delay=0.24+0.12*(0.7)+1.33*(0.05)−2.4×10−3*(0.7/0.05)=0.357.

Figure 8:
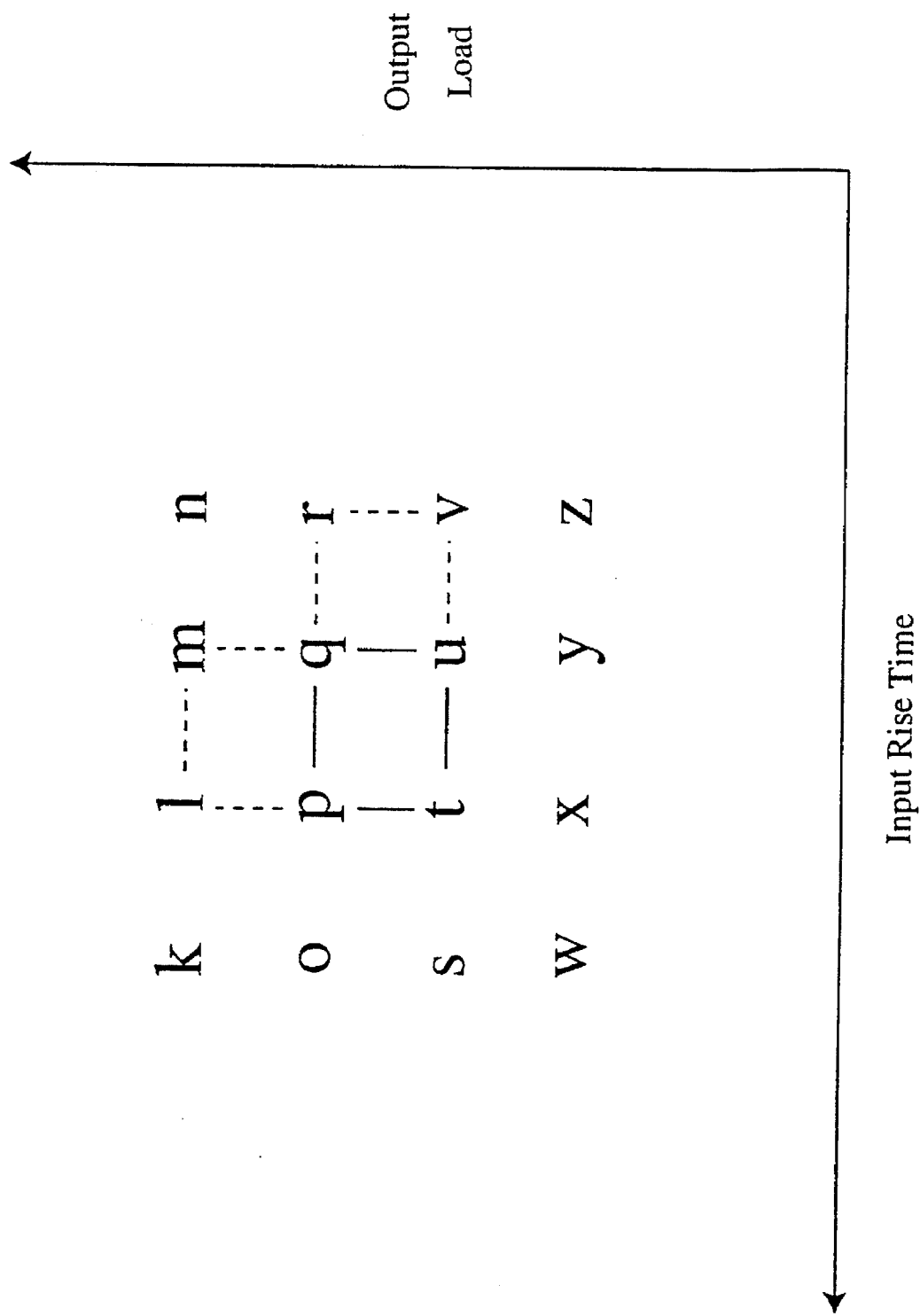
FIG. 8 is a two dimensional representation of a grid, and it is used to illustrate one technique by which a correct expression for propagation delay can be chosen.

As noted, often it is not immediately apparent which non-linear effect or effects predominate. Some empirical techniques are usually required to determine which of the four expressions will give the most accurate results within a particular subsurface. One such empirical technique will now be illustrated whereby it may be determined which of the four expressions will give the most accurate results within a particular subsurface. The grid of 16 letters shown in FIG. 8 represents 16 grid points which define 9 contiguous subsurfaces. Assume that the gate of interest has an input rise time and an output load that lie within the grid points p, q, t, and u. At this point, the system must determine which of the four expressions gives most accurate propagation delay of a gate with an input rise time and an output load which lie within the grid points p, q, t, and u. To do so, the system first determines whether the gate's input transition time and output load combination is closest to p, q, t, or u. For purposes of an example, suppose that it is determined that the input transition time and output load combination is closest to grid point q.

At this point, a larger subsurface is defined whose corner grid points are 1, m, t, and u. In addition, one of the four expressions is chosen. Using this expression, and the grid points 1, m, t, and u, the coefficients A, B, C, and D are calculated. The values of A, B, C, and D are then substituted back into the chosen expression, and the expression is used to calculate the propagation delay for grid point q. But the actual value of the propagation delay of the grid point q is known, and the calculated value will not be exactly the same as the actual value. The actual value is subtracted from the calculated value. This is called the error.

Next, for the same chosen expression, the same procedure is repeated using a new, larger subsurface defined by the grid points p, r, t, and v. Another error is obtained. The two error values are then added to give "figure of merit" for the chosen expression.

Now another expression is chosen, and the above two-step procedure is repeated to obtain a figure of merit for the newly-chosen expression. The same approach is employed on the remaining two expressions to obtain figures of merit for all four expressions. The best expression is the one with the smallest figure of merit. This best expression is the one then chosen to calculate the propagation delay of the actual gate, whose input transition time and output load lie within the grid points p, q, t, and u. As before, the grid points p, q, t, and u are used to calculate the values of A, B, C, and D to use in the expression. Of course, the values of A, B, C, or D which were found in calculations leading up to the choice of the best expression are not employed. This choice of expression, plus the values of A, B, C, and D will be added to a data base which contains the grid point information. Specifically, this information will be associated with the grid point q for the subsurface defined by the grid points p, q, t, and u. This information will then be used to calculate the propagation delay of all gates whose input transition time and output load lie within the grid points p, q, t, and u and are closest to grid point q. A computer program may be written to perform all of these calculations, make the choice of the best expression, calculate the values of A, B, C, and D, and store the results in the data base. This is only one of many techniques possible, and is offered here as an example only.

Static timing analyzers sum the values of propagation delay—as determined in the manner described above—for each gate on the slowest path to approximate the time to traverse that path. Additional accuracy can sometimes be obtained by also adding in the time required to traverse the connections between the gates on the slowest path. This "connection time" can be easily estimated for "local" connections (less than approximately 1 mm). For such connections, a pure capacitance due to the connection wiring is added to the output load of the driving gate (driven input rise time=driving output rise time). For longer (non-local) connections, gates driving distant loads must be slowed down more due to the resistance of the connecting wire as well as the capacitance. It should be noted that this RC effect also makes the input rise time of the driven gate become slower than the output rise time of the driving gate.

Although the foregoing invention has been described in some detail for purposes of clarity of understanding, it will be apparent that certain changes and modifications may be practiced within the scope of the appended claims. For instance, although the specification has described one form of an interpolation expression employing first order terms to account for non-linear gate effects, other forms could be used as well. For example, interpolation expressions that include second order terms may also be used. In addition, the reader will understand that the method of determining propagation delay described herein can be used in systems other than static timing analyzers. For example, the method could profitably be employed in a timing accurate logic simulator. Still further, the method of this invention can be employed to determine the output rise time of a gate. The only difference from the above-described approach being that the grid employed specifies output rise times rather than propagation delays.

What is claimed is:

1. A method of using a computer having a memory to determine a propagation delay associated with a selected gate in a synchronous design which includes clocked elements connected by various paths, each of which may have one or more gates, the selected gate having an associated propagation delay which is defined, at least in part, by a load on the selected gate and an input rise time which is related to the output transition time of a gate immediately preceding the selected gate on a path connecting two clocked elements, the method comprising the following steps:

(a) receiving a grid of points from said memory, each grid point specifying a propagation delay for a unique combination of gate load and input rise time;
   (b) determining the load associated with the selected gate;
   (c) determining the input rise time for the selected gate;
   (d) from the grid, identifying at least three points which specify combinations of gate load and input rise time such that these points surround a point defined by the combination of gate load and input rise time for the selected gate; and
   (e) interpolating within the at least three points identified in step (d) to determine the propagation delay of the selected gate, the interpolating being conducted by a technique that accounts for a non-linear gate effect selected from the group consisting of feedforward capacitance, source and drain resistance, and a slow input rise time.

2. The method of claim 1 wherein four points are identified from the grid in step (d) and wherein the step of interpolating employs the following expression to specify the propagation delay of the selected gate:

propagation delay=$A+B$(input rise time)+$C$(gate load)+$D$ $f$(input rise time, gate load)

where A, B, C, and D are coefficients determined from the coordinates of the four identified grid points and where $f$(input rise time, gate loads) is a first order function selected from the group consisting of (i) (input rise time)*(gate load),
(ii) (input rise time)/(gate load),
(iii) (gate load)/(input rise time), and
(iv) 1/((gate load)*(input rise time)).

3. The method of claim 1 wherein the step of interpolating interpolates on a surface defined within said at least three points, the surface representing the propagation delay as a function of gate load and input rise time, and wherein the step of interpolating imparts to that surface a component which affects the value of propagation delay most strongly in the direction of increasing input rise time and decreasing gate load.

4. The method of claim 3 wherein four points are identified from the grid and wherein the step of interpolating employs the following expression to specify the propagation delay of the selected gate:

propagation delay=$A+B$(input rise time)+$C$(gate load)+$D$ (input rise time)/(gate load)

where A, B, C, and D are coefficients determined from the coordinates of the four points identified from the identified grid points.

5. The method of claim 1 further comprising the following steps:

identifying the slowest path between two clocked elements in the synchronous design, the slowest path including a plurality of gates; and
   determining a total delay required to traverse said slowest path.

6. The method of claim 5 wherein the step of determining the total delay includes steps of determining the propagation delay associated with each gate on said slowest path.

7. The method of claim 6 wherein the step of determining the total delay further comprises the following steps:

determining a connection delay between each two gates on said slowest path; and
   summing the connection delays and propagation delays of the gates on said slowest path to obtain the total delay.

8. The method of claim 1 further comprising the following steps:

employing the total delay determined for the slowest path to develop a final synchronous design; and
   converting said final synchronous design to hardware.

9. The method of claim 8 wherein the hardware is a microprocessor.

10. The method of claim 1 further comprising a step of generating said collection of points from a numerical model of transistors which are included in gates of specified loads and input rise times.

11. The method of claim 1 further comprising a step of generating said collection of points by measuring real circuits with predefined input rise times and output loads.

12. A computer system for determining the propagation delay of a selected gate in a synchronous design, the selected gate having an associated propagation delay which is defined, at least in part, by a load on the selected gate and an input rise time for the selected gate, the computer system comprising:

a load analyzer which determines associated with the load the selected gate;
   an input rise time analyzer which determines the input rise time of the selected gate;
   a grid stored in a memory, the grid including a plurality of grid points each having a unique combination of input rise time and load, each grid point also having a value of propagation delay previously determined for a gate having the input rise time and load of that grid point; and an interpolator which determines the propagation delay of the selected gate by interpolating within at least four grid points defining a surface of propagation delay values, the surface being shaped such that it accounts for a non-linear gate effect selected from the group consisting of feedforward capacitance, source and drain resistance, and a slow input rise time.

13. The computer system of claim 12 wherein the interpolator interpolates according to the following expressions:

$$\text{propagation delay} = A + B(\text{input rise time}) + C(\text{gate load}) + D\, f(\text{input rise time, gate load})$$

where A, B, C, and D are coefficients determined from the coordinates of the four identified grid points and where f(input rise time, gate load) is a first order function selected from the group consisting of (i) (input rise time)*(gate load), (ii) (input rise time)/(gate load), (iii) (gate load)/(input rise time), and (iv) 1/((gate load)*(input rise time)).

14. The computer system of claim 12 wherein interpolator interpolates by imparting to said surface of propagation delay values a component which affects the value of propagation delay most strongly in the direction of increasing input rise time and decreasing gate load.

15. The computer system of claim 14 wherein the interpolation surface is described by the following expression:

$$\text{propagation delay} = A + B(\text{input rise time}) + C(\text{gate load}) + D(\text{input rise time})/(\text{gate load})$$

where A, B, C, and D are coefficients determined from the coordinates of four points of known propagation delay identified on said surface.

16. The computer system of claim 12 further comprising an element which identifies the slowest path between two clocked elements in the synchronous design.

17. The computer system of claim 15 further comprising means for determining a total delay on a slowest path between the two clocked elements by summing the propagation delays of all gates on said slowest path and any connection delays between each two successive gates on said slowest path.

18. A method of using a computer having a memory to determine a propagation delay associated with a selected gate in a synchronous design which includes clocked elements connected by various paths, each of which may have one or more gates, the selected gate having an associated propagation delay which is defined, at least in part, by a load on the selected gate and an input rise time which is related to the output transition time of a gate immediately preceding the selected gate on a path connecting two clocked elements, the method comprising the following steps:

(a) receiving a grid of points from said memory, each grid point specifying a propagation delay for a unique combination of gate load and input rise time;

(b) determining the load associated with the selected gate;

(c) determining the input rise time for the selected gate;

(d) from the grid, identifying at least three points which specify combinations of gate load and input rise time such that these points surround a point defined by the combination of gate load and input rise time for the selected gate;

(e) identifying from among the at least three points surrounding the selected gate's point a closest grid point which is closest to the selected gate point;

(f) specifying outer grid points at least one of which lies beyond the at least three points surrounding the selected gate's point;

(g) with said outer surrounding grid points, determining expected propagation delay values for the closest point using at least two different expressions for propagation delay;

(h) from said expected propagation delay values, identifying which one of the at least two different expressions best predict propagation delay at the closest point; and (i) interpolating within the at least three points identified in step (d) to determine the propagation delay of the selected gate, the interpolating being conducted with the expression identified in step (h).

19. The method of claim 18 wherein four points are identified from the grid in step (d) and wherein the at least two different expressions are selected from the group consisting of $$\text{propagation delay} = A + B(\text{rise time}) + C(\text{gate load}) + D(\text{rise time})(\text{gate load})$$

$$\text{propagation delay} = A + B(\text{rise time}) + C(\text{gate load}) + D(\text{gate load})/(\text{rise time})$$

$$\text{propagation delay} = A + B(\text{rise time}) + C(\text{gate load}) + D(\text{rise time})/(\text{gate load})$$

$$\text{propagation delay} = A + B(\text{rise time}) + C(\text{gate load}) + D/(\text{rise time})(\text{gate load})$$

where A, B, C, and D are coefficients determined from the coordinates of the four points identified from the grid.

20. The method of claim 18 further comprising the following steps:

identifying the slowest path between two clocked elements in the synchronous design, the slowest path including a plurality of gates; and determining a total delay required to traverse said slowest path.

21. The method of claim 20 wherein the step of determining the total delay includes steps of determining the propagation delay associated with each gate on said slowest path.

22. The method of claim 21 wherein the step of determining the total delay further comprises the following steps:

determining a connection delay between each two gates on said slowest path; and summing the connection delays and propagation delays of the gates on said slowest path to obtain the total delay.

23. The method of claim 18 further comprising the following steps:

employing the total delay determined for the slowest path to develop a final synchronous design; and converting said final synchronous design to hardware.

24. The method of claim 23 wherein the hardware is a microprocessor.

25. A method of using a computer having a memory to determine an output rise time associated with a selected gate in a synchronous design, the synchronous design including clocked elements connected by various paths, each of which may have one or more gates, the selected gate having an associated output rise time which is defined, at least in part, by a load on the selected gate and an input rise time, the method comprising the following steps:

(a) receiving a grid of points from said memory, each grid point specifying an output rise time for a unique combination of gate load and input rise time;

(b) determining the load associated with the selected gate;

(c) determining the input rise time for the selected gate;

(d) from the grid, identifying at least three points which specify combinations of gate load and input rise time such that these points surround a selected point defined by the combination of gate load and input rise time for the selected gate; and (e) interpolating within the at least three points identified in step (d) to determine the output rise time of the selected gate, the interpolating being conducted by a technique that accounts for a non-linear effect selected from the group consisting of feedforward capacitance, gate electrode resistance, source and drain resistance, and a slow input rise time.

26. The method of claim 25 wherein four points are identified from the grid in step (d) and wherein the step of interpolating employs the following expression to specify the output rise time of the selected gate:

$$\text{output rise time} = A + B(\text{input rise time}) + C(\text{gate load}) + D\, f(\text{input rise time, gate load})$$

where A, B, C, and D are coefficients determined from the coordinates of the four points identified grid points and where f(input rise time, gate loads) is a first order function selected from the group consisting of (i) (input rise time)*(gate load), (ii) (input rise time)/(gate load), (iii) (gate load)/(input rise time), and (iv) 1/((gate load)*(input rise time)).

27. The method of claim 25 wherein the step of interpolating interpolates on a surface defined within said at least three points, the surface representing the output rise time as a function of gate load and input rise time, and wherein the step of interpolating imparts to that surface a component which decreases the value of output rise time in the direction of increasing input rise time and decreasing gate load.

28. The method of claim 27 wherein four points are identified from the grid and wherein the step of interpolating employs the following expression to specify the output rise time of the selected gate:

$$\text{output rise time} = A + B(\text{input rise time}) + C(\text{gate load}) + D(\text{input rise time})/(\text{gate load})$$

where A, B, C, and D are coefficients determined from the coordinates of the four points identified from the identified grid points.

29. The method of claim 25 further comprising a step of generating said collection of points of specified loads and rise times by using a numerical model of transistors which are included in gates.

30. The method of claim 25 further comprising the following substeps before the step of interpolating:

(i) identifying from among the at least three points surrounding the selected gate's point a closest grid point which is closest to the selected gate point;

(ii) specifying outer grid points at least one of which lies beyond the at least three points surrounding the selected gate's closest grid point;

(iii) with said outer surrounding grid points, determining expected output rise time values for the closest point using at least two different expressions for output rise time;

(iv) from said expected output rise time values, identifying which one of the at least two different expressions best predict output rise time at the closest point; and (v) specifying the one of the at least two different expressions that best predicts output rise time for use in said step interpolating.

31. The method of claim 30 wherein four points are identified from the grid in step (d) and wherein the at least two different expressions are selected from the group consisting of $$\text{output rise time} = A + B(\text{rise time}) + C(\text{gate load}) + D(\text{rise time})(\text{gate load})$$

$$\text{output rise time} = A + B(\text{rise time}) + C(\text{gate load}) + D(\text{gate load})/(\text{rise time})$$

$$\text{output rise time} = A + B(\text{rise time}) + C(\text{gate load}) + D(\text{rise time})/(\text{gate load})$$

$$\text{output rise time} = A + B(\text{rise time}) + C(\text{gate load}) + D/(\text{rise time})(\text{gate load})$$

where A, B, C, and D are coefficients determined from the coordinates of the four points identified from the grid.

* * * * *

UNITED STATES PATENT AND TRADEMARK OFFICE
CERTIFICATE OF CORRECTION

PATENT NO. : 5,636,130
DATED : June 3, 1997
INVENTOR(S) : Raoul B. Salem, et al.

It is certified that error appears in the above-indentified patent and that said Letters Patent is hereby corrected as shown below:

Column 14, line 62, claim 12, change "a load analyzer which determines associated with the load the selected gate" to --a load analyzer which determines the load associated with the selected gate--.

Signed and Sealed this

Second Day of December,1997

*Attest:*

BRUCE LEHMAN

*Attesting Officer*  *Commissioner of Patents and Trademarks*